United States Patent
Tomonari et al.

(10) Patent No.: US 7,253,713 B2
(45) Date of Patent: Aug. 7, 2007

(54) COMMON-MODE CHOKE COIL

(75) Inventors: Toshio Tomonari, Tokyo (JP); Tomokazu Ito, Tokyo (JP); Toshihiro Kuroshima, Tokyo (JP)

(73) Assignee: TDK Corporation, Tokyo (JP)

( * ) Notice: Subject to any disclaimer, the term of this patent is extended or adjusted under 35 U.S.C. 154(b) by 3 days.

(21) Appl. No.: 11/264,032

(22) Filed: Nov. 2, 2005

(65) Prior Publication Data
US 2006/0097835 A1    May 11, 2006

(30) Foreign Application Priority Data
Nov. 10, 2004    (JP) .............................. 2004-326897

(51) Int. Cl.
*H01F 5/00* (2006.01)
(52) U.S. Cl. .................... 336/200; 336/223; 336/232
(58) Field of Classification Search ................ 336/220, 336/223, 232
See application file for complete search history.

(56) References Cited

U.S. PATENT DOCUMENTS

| | | | |
|---|---|---|---|
| 6,710,694 B2 * | 3/2004 | Matsuta et al. | 336/200 |
| 7,145,427 B2 * | 12/2006 | Yoshida et al. | 336/200 |
| 2004/0263309 A1 * | 12/2004 | Ito et al. | 336/200 |

FOREIGN PATENT DOCUMENTS

| | | |
|---|---|---|
| JP | 08-203737 | 8/1996 |
| JP | 09-270325 | 10/1997 |
| JP | 2002-373810 | 12/2002 |
| JP | 2003-077727 | 3/2003 |

* cited by examiner

*Primary Examiner*—Anh Mai
(74) *Attorney, Agent, or Firm*—Oliff & Berridge PLC

(57) ABSTRACT

A common-mode choke coil has first and second coil parts, a first inductance part, and a second inductance part. The first coil part and the second coil part are magnetically coupled to each other. The first inductance part is electrically connected in series to the first coil part and is not substantially magnetically coupled to the first coil part. The second inductance part is electrically connected in series to the second coil part and is not substantially magnetically coupled to the second coil part. The first inductance part and the second inductance part are not substantially magnetically coupled to each other.

11 Claims, 7 Drawing Sheets

COMMON-MODE CHOKE COIL

BACKGROUND OF THE INVENTION

1. Field of the Invention

The present invention relates to a common-mode choke coil.

2. Related Background Art

A known common-mode choke coil of this kind includes first and second coil parts magnetically coupled to each other (e.g., cf. Japanese Patent Application Laid-Open No. 8-203737). In the common-mode choke coil described in Japanese Patent Application Laid-Open No. 8-203737, a coil conductor constituting the first coil part and a coil conductor constituting the second coil part are located between a pair of magnetic substrates.

SUMMARY OF THE INVENTION

An object of the present invention is to provide a common-mode choke coil permitting adjustment of inductance values of inductor components not substantially magnetically coupled to respective inductor components composed of first and second coil parts.

Incidentally, the differential transmission system is one of systems for transmitting digital signals between electronic devices. The differential transmission system is a system of feeding mutually opposite digital signals on a pair of lines, and the differential transmission cancels out radiated noise from signal lines, and external noise. The differential transmission system reduces noise by virtue of the cancellation of external noise and is thus able to transmit signals in small amplitude. Furthermore, since the signals have small amplitude in the differential transmission system and it thus offers the advantage of reduction in rise and fall times of signals, which implements increase in speed of signal transmission.

The interface standards using this differential transmission system include USB (Universal Serial Bus), IEEE1394, LVDS (Low Voltage Differential Signaling), DVI (Digital Video Interface), HDMI (High-Definition Multimedia Interface), and so on. Among these, the IDMI is an interface enabling transmission of more digital signals, and high-speed interface enabling transmission of uncompressed digital signals between a source device (e.g., a DVD player, a set-top box, or the like) and a sink device (e.g., a digital television set, a projector, or the like). The HDMI permits high-speed transmission of video signals and sound signals through a single cable.

In the case of the high-speed interfaces such as the HDMI, the structure of IC itself becomes more susceptible to ESD (Electrostatic Discharge), in order to realize the increase of speed. For this reason, there are increasing demands for countermeasures against ESD in the high-speed transmission type ICs, and capacitive elements such as varistors and Zener diodes are used as ESD-prevention components.

However, insertion of capacitive elements as ESD-prevention components in the transmission lines was found to cause a new problem that signals through the transmission lines, particularly, high-frequency (200 MHz or higher) or high-speed pulse signals were reflected and attenuated. This results from the fact that with insertion of the capacitive elements in the transmission lines, the capacitance of the capacitive elements lowers the characteristic impedance at the position of insertion of the capacitive elements in the transmission lines so as to cause an impedance mismatch at the position. The existence of the impedance-mismatched portion in the transmission lines leads to reflection of high-frequency components of signals at the characteristic impedance-mismatched portion and, in turn, to occurrence of return loss. This results in heavily attenuating the signals. In addition, the reflection can induce unwanted radiation in the transmission lines, so as to cause noise. For the HDMI, specified values of the characteristic impedance of the transmission lines (TDR standard) are defined as $100\Omega\pm15\%$ (High-Definition Multimedia Interface Specification Version 1.1).

The Inventors conducted elaborate research on a signal transmission circuit capable of suppressing the reduction of the characteristic impedance even with use of the capacitive elements as ESD-prevention components. As a result of the research, the Inventors found the new fact that the reduction of the characteristic impedance was effectively suppressed by providing a common-mode choke coil and inductors not substantially magnetically coupled to the inductors included in the common-mode choke coil, before the capacitive elements in a state in which they were electrically connected in series to each other.

However, the adoption of the new inductors in addition to the common-mode choke coil can pose new problems such as an increase in the number of parts, an increase of cost, degradation of reliability, and so on. For this reason, the Inventors came to find the new fact that the new problems described above could be solved by incorporating the inductors in the common-mode choke coil.

In light of this fact, a common-mode choke coil according to the present invention is a common-mode choke coil comprising: first and second coil parts magnetically coupled to each other; a first inductance part electrically connected in series to the first coil part and not substantially magnetically coupled to the first coil part; and a second inductance part electrically connected in series to the second coil part and not substantially magnetically coupled to the second coil part, wherein the first inductance part and the second inductance part are not substantially magnetically coupled to each other.

The common-mode choke coil according to the present invention comprises the first inductance part not substantially magnetically coupled to the first coil part, and the second inductance part not substantially magnetically coupled to the second coil part. The first inductance part and the second inductance part are not substantially magnetically coupled to each other. Therefore, the first and second inductance parts permit adjustment of inductance values of the inductor components not substantially magnetically coupled to the respective inductor components composed of the first and second coil parts.

Preferably, each of the first and second inductance parts includes a conductor of meander shape or a conductor of spiral shape.

Preferably, the first coil part includes a first coil conductor disposed between magnetic layers, the second coil part includes a second coil conductor disposed between the magnetic layers, and each of the first and second inductance parts includes a conductor disposed between the magnetic layers. This configuration realizes the common-mode choke coil of a multilayer or thin-film type, and this common-mode choke coil also permits adjustment of the inductance values of the inductor components not substantially magnetically coupled to the respective inductor components composed of the first and second coil parts.

Furthermore, preferably, the first coil conductor and the second coil conductor are stacked through an insulator.

Preferably, the first coil conductor and the conductor included in the first inductance part are located on a common surface, and the second coil conductor and the conductor included in the second inductance part are located on a common surface. This configuration permits the first coil conductor and the conductor included in the first inductance part to be formed in the same step, and also permits the second coil conductor and the conductor included in the second inductance part to be formed in the same step. These result in preventing an increase in the number of production steps of the common-mode choke coil.

The present invention successfully provides the common-mode choke coil permitting the adjustment of the inductance values of the inductor components not substantially magnetically coupled to the respective inductor components composed of the first and second coil parts.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. Identical elements, or elements with the same functionality will be denoted by the same reference symbols throughout the description, without redundant description.

First Embodiment

Figure 1:
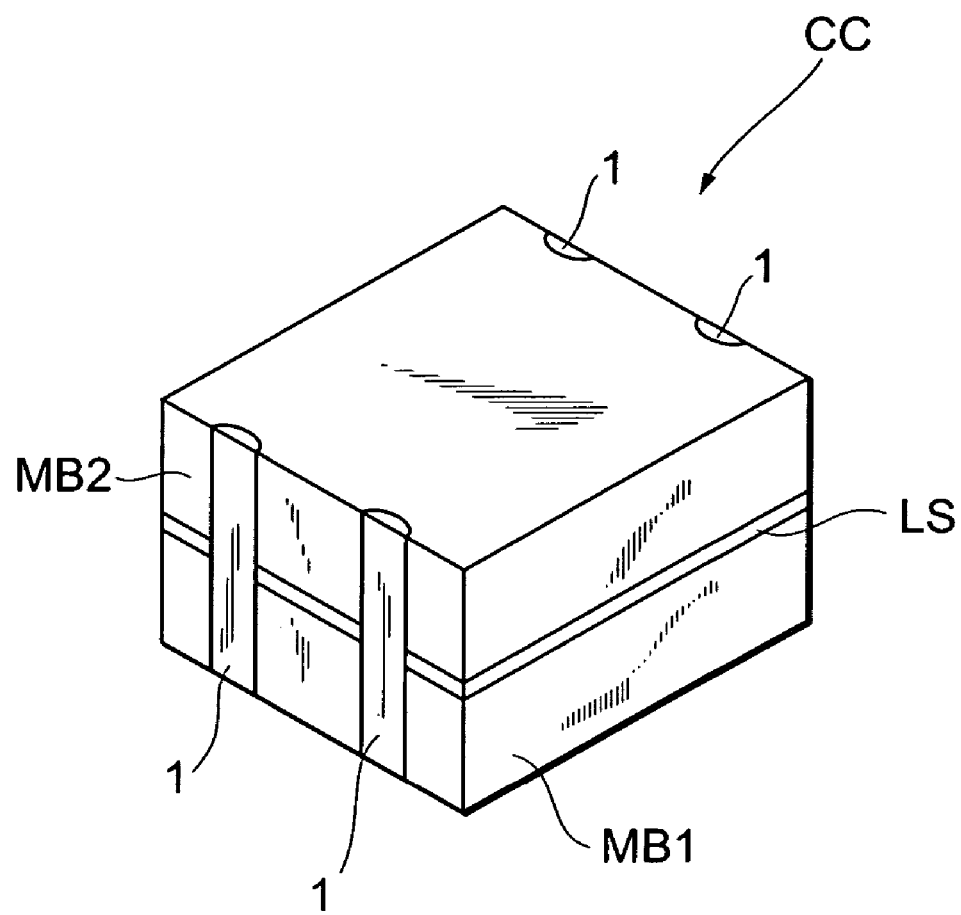
FIG. 1 is a perspective view showing the common-mode choke coil according to the first embodiment.
Figure 2:
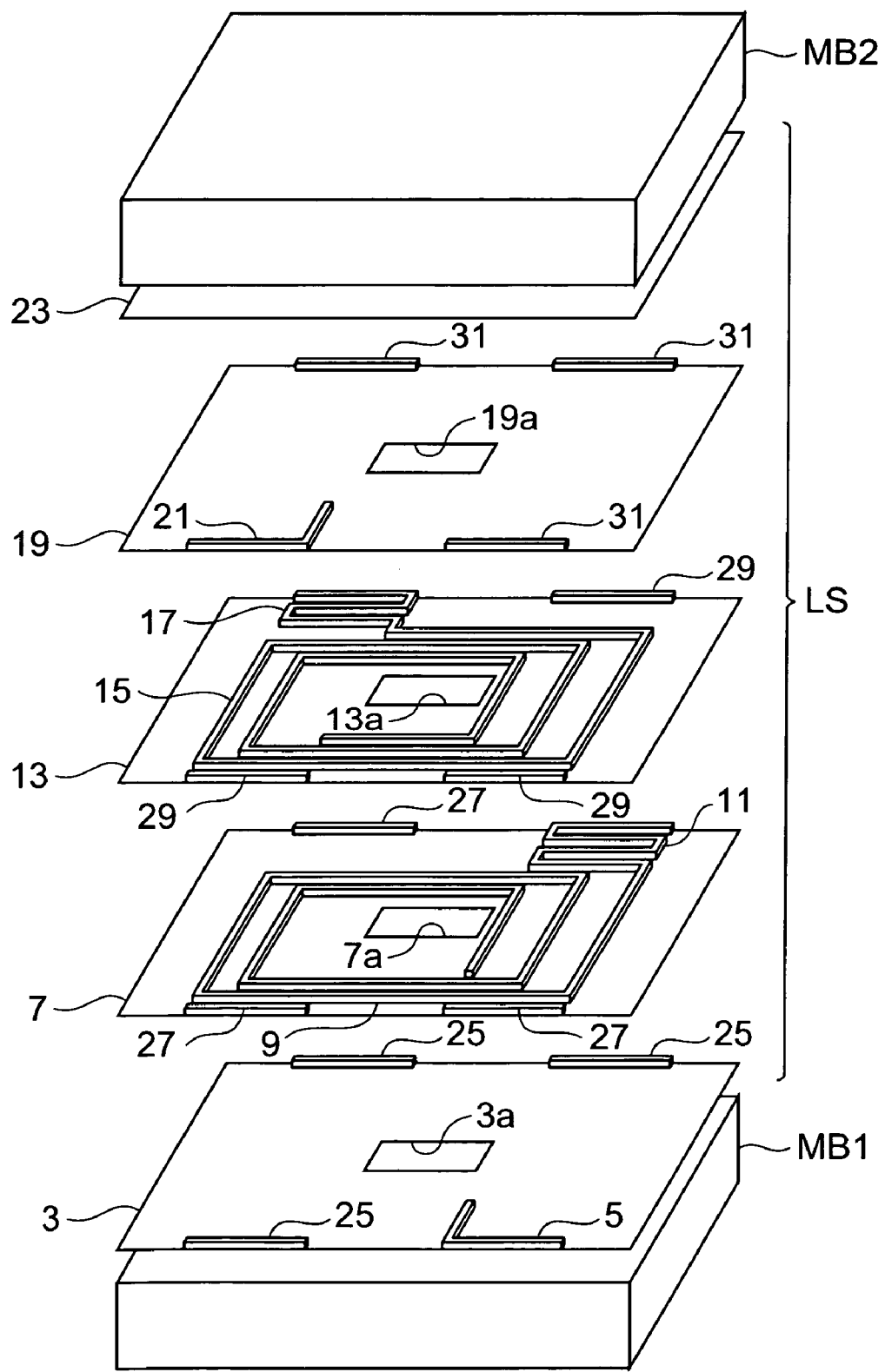
FIG. 2 is an exploded configuration diagram of the common-mode choke coil according to the first embodiment.
Figure 3:
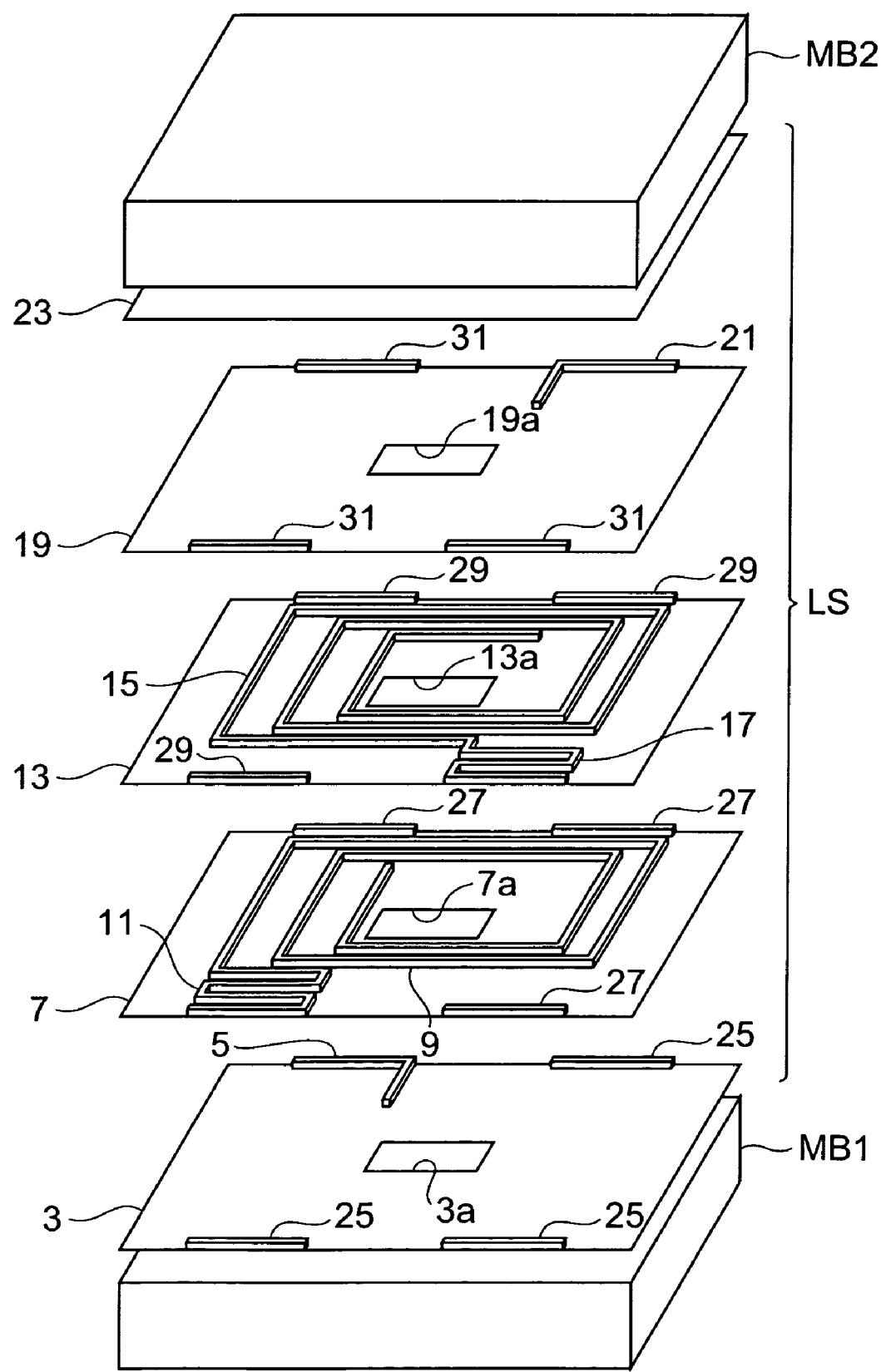
FIG. 3 is an exploded configuration diagram of the common-mode choke coil according to the first embodiment.

FIG. 1 is a perspective view showing the common-mode choke coil according to the first embodiment. FIGS. 2 and 3 are exploded configuration diagrams of the common-mode choke coil according to the first embodiment.

The common-mode choke coil CC, as shown in FIG. 1, is a common-mode choke coil of the thin-film type. The common-mode choke coil CC has a first magnetic substrate MB1 (magnetic layer), a layer structure LS, and a second magnetic substrate MB2 (magnetic layer). Terminal electrodes 1 are formed on the external surfaces of the laminate consisting of the first magnetic substrate MB1, layer structure LS, and second magnetic substrate MB2.

The first magnetic substrate MB1 and the second magnetic substrate MB2 are made of a magnetic material such as sintered ferrite or complex ferrite (resin containing ferrite of powder form).

The layer structure LS, as shown in FIGS. 2 and 3, is a multilayer of multiple layers formed by thin-film forming technology. The layer structure LS includes a first insulating layer 3, a first lead conductor 5, a second insulating layer 7, a first coil conductor 9, a second lead conductor 11, a third insulating layer 13, a second coil conductor 15, a third lead conductor 17, a fourth insulating layer 19, a fourth lead conductor 21, and a fifth insulating layer 23.

The first insulating layer 3 is made of a resin material with excellent electric and magnetic insulation and good workability. The first insulating layer 3 is made, for example, of a polyimide resin, or an epoxy resin, or the like. The first insulating layer 3 is intended for relieving unevenness of the first magnetic substrate MB1 and improving adhesion to the conductors such as the first lead conductor 5. The thickness of the first insulating layer 3 can be set, for example, in the range of 0.1 to 10 μm.

The first insulating layer 3, as also shown in FIGS. 2 and 3, is provided with an aperture 3a for placement of a magnetic body (not shown) for forming a closed magnetic circuit between the first magnetic substrate MB1 and the second magnetic substrate MB2, and a cut for exposing an edge region of the first lead conductor 5. The aperture 3a is formed in the central region of the first coil conductor 9 and the second coil conductor 15. The aforementioned magnetic body is made of a magnetic material such as complex ferrite. The first insulating layer 3 is formed as follows. First, the aforementioned resin material is applied onto the first magnetic substrate MB1. Then the applied resin material is subjected to exposure and development to be cured in a state in which the aperture 3a, the cut, etc. are formed at the predetermined positions. Available methods of applying the resin material include the spin coat method, the dip method, the spray method, and so on.

The first lead conductor 5 is formed on the first insulating layer 3. One end of the first lead conductor 5 is electrically connected to the inside end of the spiral of the first coil conductor 9, and the other end of the first lead conductor 5 is exposed. The thickness of the first lead conductor 5 can be set, for example, in the range of 1 to 10 μm. The width of the first lead conductor 5 can be set, for example, in the range of 1 to 25 μm.

The second insulating layer 7 is made of a resin material with excellent electric and magnetic insulation and good workability. The second insulating layer 7 is made, for example, of a polyimide resin, or an epoxy resin, or the like. The thickness of the second insulating layer 7 can be set, for example, in the range of 1 to 20 μm. The second insulating layer 7 is provided with an aperture 7a for placement of the aforementioned magnetic body, and a cut for exposing an edge region of the second lead conductor 11. The aperture 7a is formed corresponding to the aperture 3a in the central region of the first coil conductor 9 and the second coil conductor 15. The second insulating layer 7 is formed on the first insulating layer 3 and the first lead conductor 5 by a method similar to that of the first insulating layer 3.

The first coil conductor 9 and the second lead conductor 11 are formed on the second insulating layer 7. The first coil conductor 9 is of spiral shape and contains a metal material with electric conductivity (e.g., Cu or the like). The outside end of the spiral of the first coil conductor 9 is continuous to one end of the second lead conductor 11. This results in electrically connecting the first coil conductor 9 and the second lead conductor 11 in series to each other.

The second lead conductor 11 is of meander shape and contains a metal material with electric conductivity (e.g., Cu or the like). The other end of the second lead conductor 11 is exposed. The thickness of the first coil conductor 9 and the second lead conductor 11 can be set, for example, in the range of 3 to 20 µm. The width of the first coil conductor 9 and the second lead conductor 11 can be set, for example, in the range of 5 to 30 µm.

The first coil conductor 9 and the second lead conductor 11 are formed as follows. A conductor thin film is formed on the second insulating layer 7, and a pattern of the first coil conductor 9 and the second lead conductor 11 is formed by photolithography. The first coil conductor 9 and the second lead conductor 11 may also be formed by forming a resist film after formation of a ground conductor film, forming a mold corresponding to the pattern of the first coil conductor 9 and the second lead conductor 11 in the resist film by photolithography, and growing the conductive metal material in the mold by electroplating. Of course, the resist film used as the mold and the exposed ground conductor film are removed.

The second insulating layer 7 is provided with an opening (contact hole) for bringing the first coil conductor 9 formed on the second insulating layer 7, into contact with the first lead conductor 5 formed on the first insulating layer 3, thereby establishing electric connection between them.

The third insulating layer 13 is made of a resin material with excellent electric and magnetic insulation and good workability as the first and second insulating layers 3, 7 were. The third insulating layer 13 is made, for example, of a polyimide resin, an epoxy resin, or the like. The thickness of the third insulating layer 13 can be set, for example, in the range of 1 to 20 µm. The third insulating layer 13 is provided with an aperture 13a for placement of the aforementioned magnetic body, and a cut for exposing an edge region of the third lead conductor 17. The aperture 13a is formed corresponding to the apertures 3a, 7a, in the central region of the first coil conductor 9 and the second coil conductor 15. The third insulating layer 13 is formed on the second insulating layer 7, the first coil conductor 9, and the second lead conductor 11 by a method similar to that of the first insulating layer 3.

The second coil conductor 15 and the third lead conductor 17 are formed on the third insulating layer 13. The second coil conductor 15 is of spiral shape and contains a metal material with electric conductivity (e.g., Cu or the like). The outside end of the spiral of the second coil conductor 15 is continuous to one end of the third lead conductor 17. This results in electrically connecting the second coil conductor 15 and the third lead conductor 17 in series to each other.

The third lead conductor 17 is of meander shape and contains a metal material with electric conductivity (e.g., Cu or the like). The other end of the third lead conductor 17 is exposed. The thickness of the second coil conductor 15 and the third lead conductor 17 can be set, for example, in the range of 3 to 20 µm. The width of the second coil conductor 15 and the third lead conductor 17 can be set, for example, in the range of 5 to 30 µm. The second coil conductor 15 and the third lead conductor 17 are formed by a method similar to that of the first coil conductor 9 and the second lead conductor 11.

The fourth insulating layer 19 is made of a resin material with excellent electric and magnetic insulation and good workability as the first to third insulating layers 3, 7, 13 were. The fourth insulating layer 19 is made, for example, of a polyimide resin, an epoxy resin, or the like. The thickness of the fourth insulating layer 19 can be set, for example, in the range of 1 to 20 µm. The fourth insulating layer 19 is provided with an aperture 19a for placement of the aforementioned magnetic body, and a cut for exposing an edge region of the fourth lead conductor 21. The aperture 19a is formed corresponding to the apertures 3a, 7a, 13a, in the central region of the first coil conductor 9 and the second coil conductor 15. The fourth insulating layer 19 is formed on the third insulating layer 13, the second coil conductor 15, and the third lead conductor 17 by a method similar to that of the first insulating layer 3.

The fourth lead conductor 21 is formed on the fourth insulating layer 19. One end of the fourth lead conductor 21 is electrically connected to the inside end of the spiral of the second coil conductor 15 and the other end of the fourth lead conductor 21 is exposed. The thickness of the fourth lead conductor 21 can be set, for example, in the range of 1 to 10 µm. The width of the fourth lead conductor 21 can be set, for example, in the range of 1 to 25 µm.

The fourth insulating layer 19 is provided with an opening (contact hole) for bringing the second coil conductor 15 formed on the third insulating layer 13, into contact with the fourth lead conductor 21 formed on the fourth insulating layer 19, thereby establishing electric connection between them.

The fifth insulating layer 23 is made of a resin material with excellent electric and magnetic insulation and good workability as the first to fourth insulating layers 3, 7, 13, 19 were. The fifth insulating layer 23 is made, for example, of a polyimide resin, an epoxy resin, or the like. The thickness of the fifth insulating layer 23 can be set, for example, in the range of 1 to 20 µm. The fifth insulating layer 23 is provided with an aperture (not shown) for placement of the aforementioned magnetic body. The aperture is formed corresponding to the apertures 3a, 7a, 13a, 19a, in the central region of the first coil conductor 9 and the second coil conductor 15. The fifth insulating layer 23 is formed on the fourth insulating layer 19 and the fourth lead conductor 21 by a method similar to that of the first insulating layer 3.

The first insulating layer 3 is provided with cuts formed at the positions corresponding to the other end of the second lead conductor 11, the other end of the third lead conductor 17, and the other end of the fourth lead conductor 21. Conductors 25 to be electrically connected to the ends of the respective conductors 11, 17, 21 are provided in the cuts formed in the first insulating layer 3. The second insulating layer 7 is provided with cuts formed at the positions corresponding to the other end of the first lead conductor 5, the other end of the third lead conductor 17, and the other end of the fourth lead conductor 21. Conductors 27 to be electrically connected to the ends of the respective conductors 5, 17, 21 are provided in the cuts formed in the second insulating layer 7. The third insulating layer 13 is provided with cuts formed at the positions corresponding to the other end of the first lead conductor 5, the other end of the second lead conductor 11, and the other end of the fourth lead conductor 21. Conductors 29 to be electrically connected to the ends of the respective conductors 5, 11, 21 are provided in the cuts formed in the third insulating layer 13. The fourth insulating layer 19 is provided with cuts formed at the positions corresponding to the other end of the first lead conductor 5, the other end of the second lead conductor 11, and the other end of the third lead conductor 17. Conductors 31 to be electrically connected to the ends of the respective conductors 5, 11, 17 are provided in the cuts formed in the fourth insulating layer 19.

Incidentally, after the fifth insulating layer 23 is formed, a complex ferrite of paste form prepared by mixing ferrite powder in a resin material such as an epoxy resin is applied onto the fifth insulating layer 23 and then cured. At this time, the complex ferrite of paste form is filled in recesses composed of the apertures 3a, 7a, 13a, 19a. This results in arranging the aforementioned magnetic body in the apertures 3a, 7a, 13a, 19a. After applied and cured on the fifth insulating layer 23, the complex ferrite is polished to have a flat surface. The second magnetic substrate MB2 is bonded through an adhesive layer (not shown) onto the complex ferrite with the polished surface. The adhesive layer can be comprised, for example, of an adhesive such as an epoxy resin, a polyimide resin, or a polyamide resin. The second magnetic substrate MB2 can be replaced by the aforementioned cured complex ferrite that is formed in a larger thickness.

The first to fourth lead conductors 5, 11, 17, 21 are in contact with the corresponding terminal electrodes 1 to establish electric connection between them. Each conductor 5, 9, 11, 15, 17, 21 may be plated with Ni, in view of corrosion resistance, adhesion to the insulating layer 7, 13, 19, 23, and so on.

In the common-mode choke coil CC of the above-described configuration, the first coil conductor 9 and the second coil conductor 15 are stacked through the third insulating layer 13 as an insulator. This results in magnetically coupling the first coil conductor 9 and the second coil conductor 15 to each other.

When viewed from the stack direction of the layer structure LS (the direction normal to the insulating layers 3, 7, 13, 19, 23), the second lead conductor 11 scarcely overlaps with the first coil conductor 9 and the second coil conductor 15. For this reason, the inductor components composed of the first coil conductor 9 and the second coil conductor 15 are not substantially magnetically coupled to the inductor component composed of the second lead conductor 11. The second lead conductor 11 and the first coil conductor 9 are set in such a positional relation on the second insulating layer 7 that the second lead conductor 11 and the first coil conductor 9 are not substantially magnetically coupled to each other.

When viewed from the stack direction of the layer structure LS, the third lead conductor 17 scarcely overlaps with the first coil conductor 9 and the second coil conductor 15. For this reason, the inductor components composed of the first coil conductor 9 and the second coil conductor 15 are not substantially magnetically coupled to the inductor component composed of the third lead conductor 17. The third lead conductor 17 and the second coil conductor 15 are set in such a positional relation on the third insulating layer 13 that the third lead conductor 17 and the second coil conductor 15 are not substantially magnetically coupled to each other.

When viewed from the stack direction of the layer structure LS, the second lead conductor 11 does not overlap with the third lead conductor 17. For this reason, the inductor component composed of the second lead conductor 11 is not substantially magnetically coupled to the inductor component composed of the third lead conductor 17.

The term "not substantially magnetically coupled" means that the coupling factor is not more than 0.1.

As the line length of the second lead conductor 11 becomes longer, the inductance value thereof increases. As the line length of the third lead conductor 17 becomes longer, the inductance value thereof increases.

In the present first embodiment, as described above, the second lead conductor 11 and the third lead conductor 17 permit adjustment of the inductance values of the inductor components not substantially magnetically coupled to the respective inductor components composed of the first and second coil conductors 9, 15.

In the first embodiment, the first and second coil conductors 9, 15 are arranged between the first magnetic substrate MB1 and the second magnetic substrate MB2, and the second and third lead conductors 11, 17 are also arranged between the first magnetic substrate MB1 and the second magnetic substrate MB2. This realizes the common-mode choke coil of the multilayer or thin-film type (the common-mode choke coil CC of the thin-film type in the present embodiment), and the common-mode choke coil CC also permits the adjustment of the inductance values of the inductor components not substantially magnetically coupled to the respective inductor components composed of the first and second coil conductors 9, 15.

In the first embodiment, the first coil conductor 9 and the second lead conductor 11 are located on the common surface, and the second coil conductor 15 and the third lead conductor 17 are located on the common surface. This permits the first coil conductor 9 and the second lead conductor 11 to be formed in the same step and also permits the second coil conductor 15 and the third lead conductor 17 to be formed in the same step. These result in preventing an increase in the number of production steps of the common-mode choke coil CC.

Second Embodiment

Figure 4:
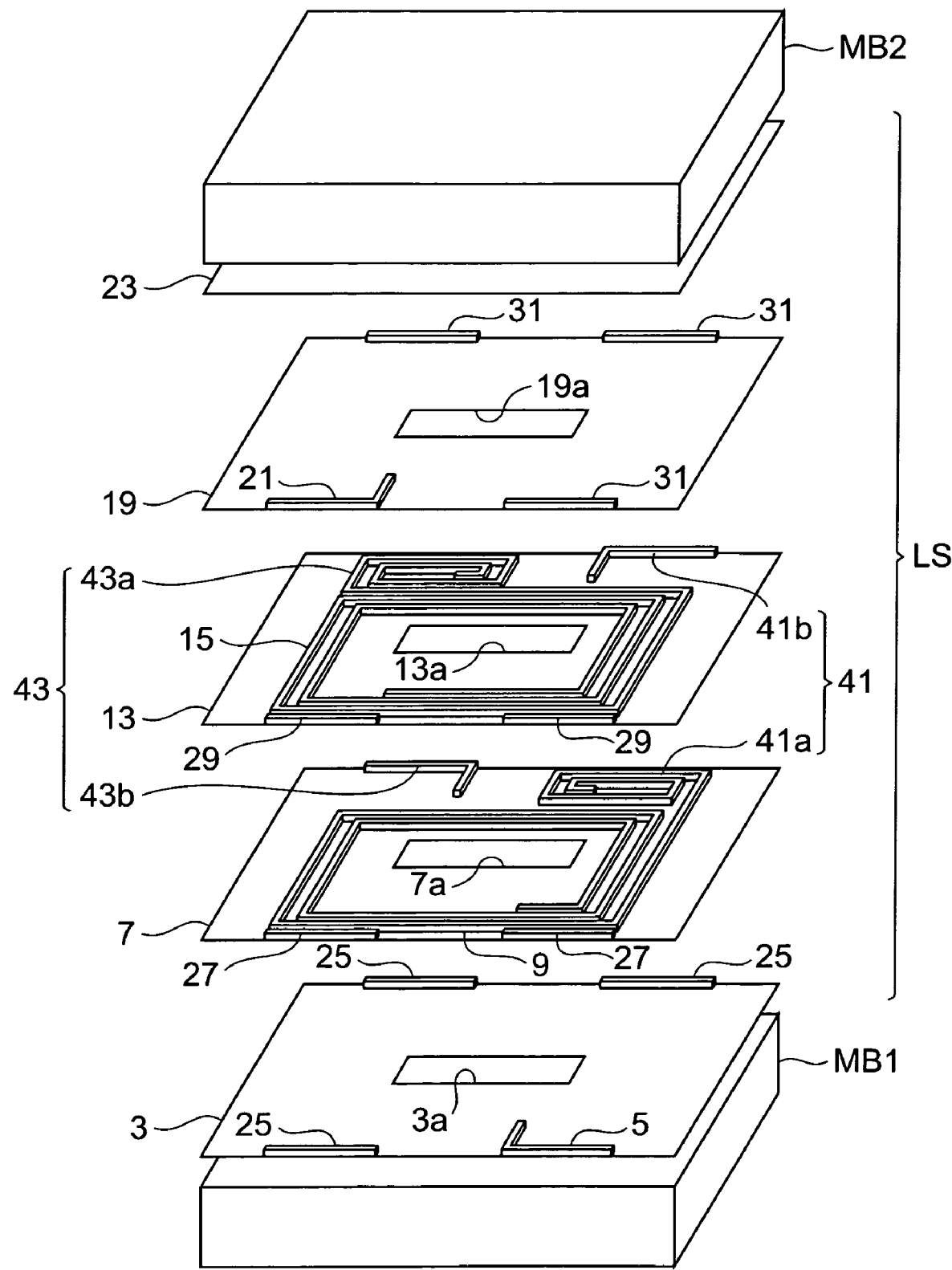
FIG. 4 is an exploded configuration diagram of the common-mode choke coil according to the second embodiment.
Figure 5:
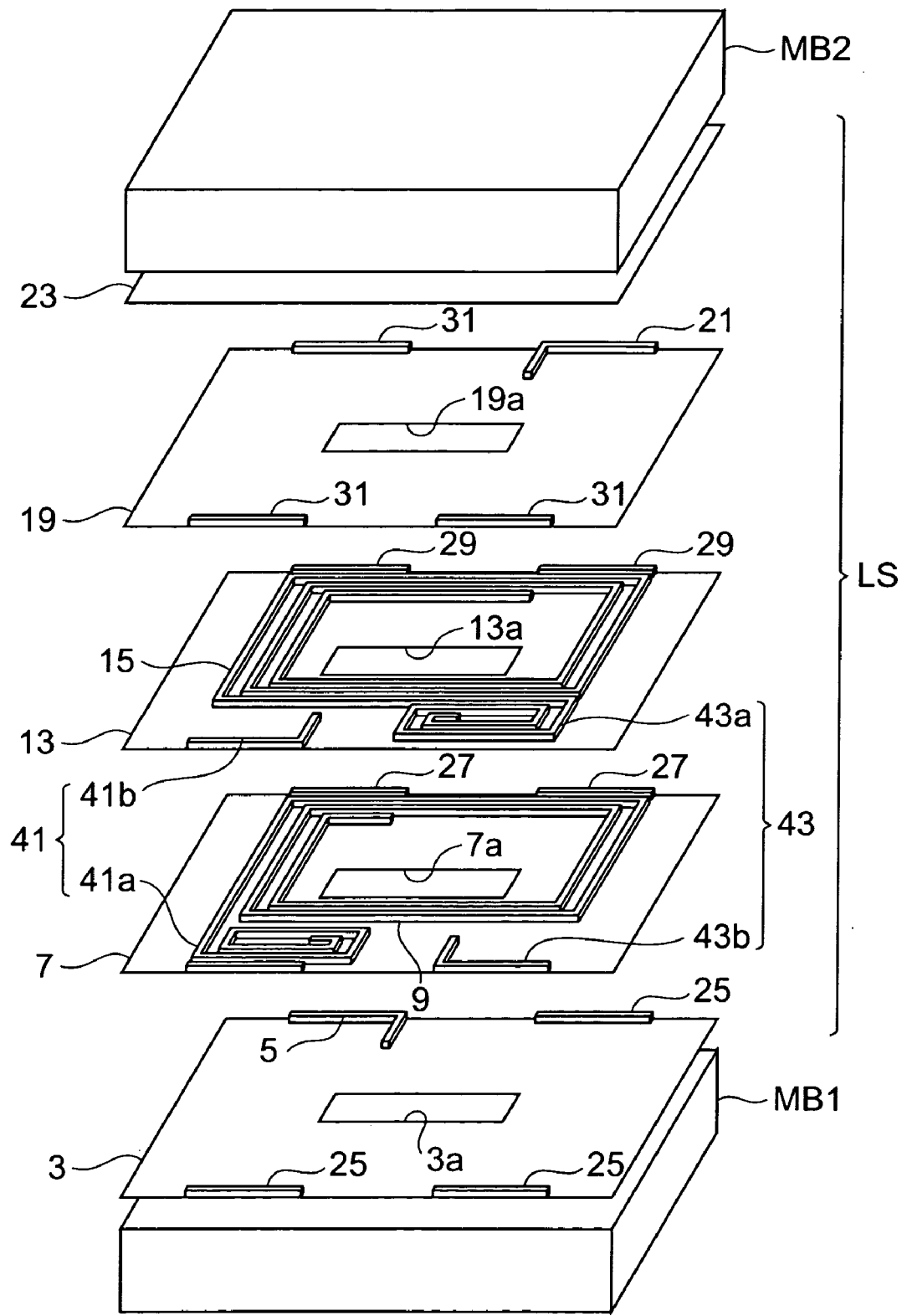
FIG. 5 is an exploded configuration diagram of the common-mode choke coil according to the second embodiment.

FIGS. 4 and 5 are exploded configuration diagrams of the common-mode choke coil according to the second embodiment. The common-mode choke coil CC of the second embodiment is different in configurations of the second and third lead conductors 11, 17 from the common-mode choke coil CC of the first embodiment.

The common-mode choke coil CC of the second embodiment is also a common-mode choke coil of the thin-film type as the common-mode choke coil CC of the first embodiment was. The common-mode choke coil CC of the second embodiment has a first magnetic substrate MB1 (magnetic layer), a layer structure LS, and a second magnetic substrate MB2 (magnetic layer) (cf. FIG. 1).

The layer structure LS, as shown in FIGS. 4 and 5, is a multilayer consisting of a plurality of layers formed by thin-film forming technology. The layer structure LS includes a first insulating layer 3, a first lead conductor 5, a second insulating layer 7, a first coil conductor 9, a second lead conductor 41, a third insulating layer 13, a second coil conductor 15, a third lead conductor 43, a fourth insulating layer 19, a fourth lead conductor 21, and a fifth insulating layer 23.

The second lead conductor 41 has a first conductor portion 41a and a second conductor portion 41b. The second lead conductor 41 contains a metal material with electric conductivity (e.g., Cu or the like). The thickness of the second lead conductor 41 can be set, for example, in the range of 3 to 20 µm. The width of the second lead conductor 41 can be set, for example, in the range of 5 to 30 µm.

The first conductor portion 41a is of spiral shape and is formed on the second insulating layer 7. The outside end of the spiral of the first conductor portion 41a is continuous to the outside end of the spiral of the first coil conductor 9. This results in electrically connecting the first coil conductor 9 and the second lead conductor 41 in series to each other. The second conductor portion 41b is formed on the third insulating layer 13. One end of the second conductor portion 41b is electrically connected to the inside end of the spiral of the first conductor portion 41a. The other end of the second conductor portion 41b is exposed.

The third lead conductor 43 has a first conductor portion 43a and a second conductor portion 43b. The third lead conductor 43 contains a metal material with electric conductivity (e.g., Cu or the like). The thickness of the third lead conductor 43 can be set, for example, in the range of 3 to 20 µm. The width of the third lead conductor 43 can be set, for example, in the range of 5 to 30 µm.

The first conductor portion 43a is of spiral shape and is formed on the third insulating layer 13. The outside end of the spiral of the first conductor portion 43a is continuous to the outside end of the spiral of the second coil conductor 15. This results in electrically connecting the second coil conductor 15 and the third lead conductor 43 in series to each other. The second conductor portion 43b is formed on the second insulating layer 7. One end of the second conductor portion 43b is electrically connected to the inside end of the spiral of the first conductor portion 43a. The other end of the second conductor portion 43b is exposed.

The second lead conductor 41 and the third lead conductor 43 are formed by a method similar to those of the second lead conductor 11 and the third lead conductor 17 in the first embodiment. The first to fourth lead conductors 5, 41, 17, 43 are in contact with their respective corresponding terminal electrodes 1 to establish electric connection between them. The second lead conductor 41 and the third lead conductor 43 may be plated with Ni, in view of corrosion resistance, adhesion to the insulating layers 13, 19, and so on.

The third insulating layer 13 is provided with an opening (contact hole) for establishing electric connection through contact between the second conductor portion 41b formed on the third insulating layer 13 and the first conductor portion 41a formed on the second insulating layer 7. The third insulating layer 13 is provided with an opening (contact hole) for establishing electric connection through contact between the first conductor portion 43a formed on the third insulating layer 13 and the second conductor portion 43b formed on the second insulating layer 7.

The conductors 25 are electrically connected to the other end of the second conductor portion 41b, to the other end of the second conductor portion 43b, and to the other end of the fourth lead conductor 21. The conductors 27, 29 are electrically connected to the other end of the first lead conductor 5 and to the other end of the fourth lead conductor 21. The conductors 31 are electrically connected to the other end of the second conductor portion 41b, to the other end of the second conductor portion 43b, and to the other end of the first lead conductor 5.

In the common-mode choke coil CC of the above-described configuration, when viewed from the stack direction of the layer structure LS, the second lead conductor 41 scarcely overlaps with the first coil conductor 9 and the second coil conductor 15. For this reason, the inductor components composed of the first coil conductor 9 and the second coil conductor 15 are not substantially magnetically coupled to the inductor component composed of the second lead conductor 41. Of course, the first conductor portion 41a and the first coil conductor 9 are set in such a positional relation on the second insulating layer 7 that the first conductor portion 41a and the first coil conductor 9 are not substantially magnetically coupled to each other.

When viewed from the stack direction of the layer structure LS, the third lead conductor 43 scarcely overlaps with the first coil conductor 9 and the second coil conductor 15. For this reason, the inductor components composed of the first coil conductor 9 and the second coil conductor 15 are not substantially magnetically coupled to the inductor component composed of the third lead conductor 43. Of course, the first conductor portion 43a and the second coil conductor 15 are set in such a positional relation on the third insulating layer 13 that the first conductor portion 43a and the second coil conductor 15 are not substantially magnetically coupled to each other.

When viewed from the stack direction of the layer structure LS, the second lead conductor 41 (first conductor portion 41a) does not overlap with the third lead conductor 43 (first conductor portion 43a). For this reason, the inductor component composed of the second lead conductor 41 is not substantially magnetically coupled to the inductor component composed of the third lead conductor 43.

As the line length of the first conductor portions 41a, 43a becomes longer, the inductance value thereof increases. The inductance value also increases with increase in the number of windings of the spirals of the first conductor portions 41a, 43a.

In the present second embodiment, as described above, the second lead conductor 41 (first conductor portion 41a) and the third lead conductor 43 (first conductor portion 43a) permit adjustment of the inductance values of the inductor components not substantially magnetically coupled to the respective inductor components composed of the first and second coil conductors 9, 15.

In the second embodiment, the first and second coil conductors 9, 15 are arranged between the first magnetic substrate MB1 and the second magnetic substrate MB2, and the second and third lead conductors 41, 43 are also arranged between the first magnetic substrate MB1 and the second magnetic substrate MB2. This realizes the common-mode choke coil of the multilayer or thin-film type (the common-mode choke coil CC of the thin-film type in the present embodiment) and this common-mode choke coil CC also permits the adjustment of the inductance values of the inductor components not substantially magnetically coupled to the respective inductor components composed of the first and second coil conductors 9, 15.

In the second embodiment, the first coil conductor 9, the first conductor portion 41a of the second lead conductor 41, and the second conductor portion 43b of the third lead conductor 43 are located on the same surface, and the second coil conductor 15, the second conductor portion 41b of the second lead conductor 41, and the first conductor portion 43a of the third lead conductor 43 are located on the same surface. This permits the first coil conductor 9 and the portions of the second and third lead conductors 41, 43 to be formed in the same step, and also permits the second coil conductor 15 and the rest portions of the second and third lead conductors 41, 43 to be formed in the same step. These result in preventing an increase in the number of production steps of the common-mode choke coil CC.

Figure 6:
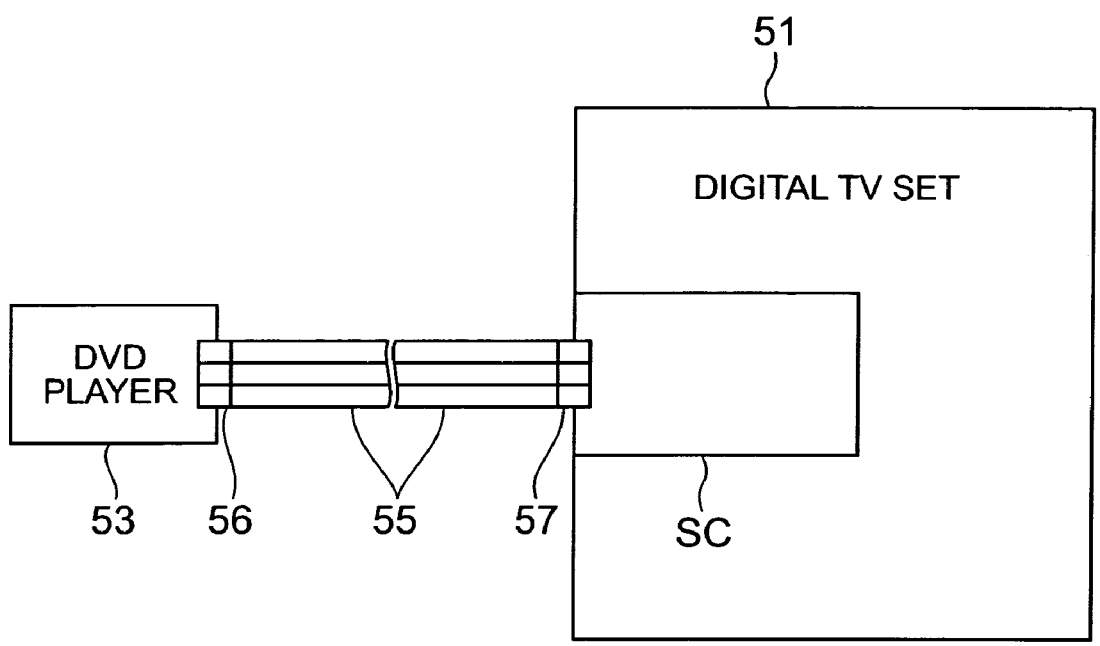
FIG. 6 is a schematic diagram showing a signal transmission circuit to which the common-mode choke coil of the first embodiment is applied.
Figure 7:
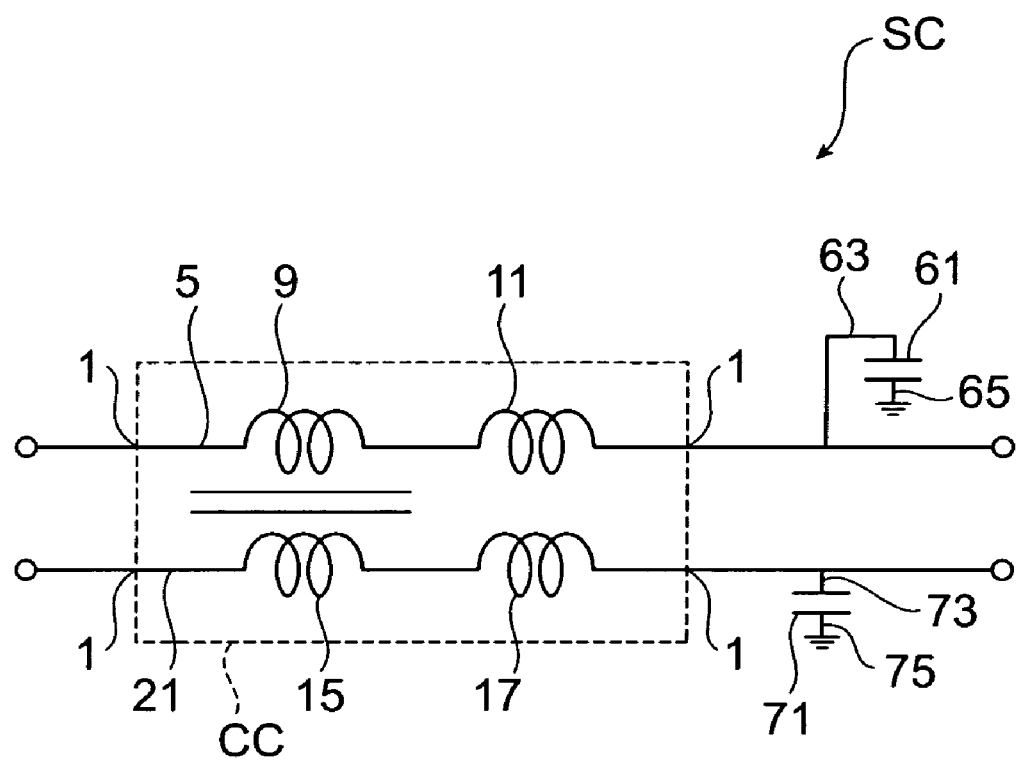
FIG. 7 is a circuit diagram showing a signal transmission circuit to which the common-mode choke coil of the first embodiment is applied.

Subsequently, configurations of signal transmission circuits to which the common-mode choke coil CC of the first embodiment is applied, will be described with reference to FIGS. 6 and 7. FIG. 6 is a schematic diagram showing a signal transmission circuit to which the common-mode choke coil of the first embodiment is applied. FIG. 7 is a circuit diagram showing a signal transmission circuit to which the common-mode choke coil of the first embodiment is applied. It is a matter of course that the common-mode choke coil CC of the second embodiment can also be applied instead of the common-mode choke coil CC of the first embodiment.

As shown in FIG. 6, a digital television set 51 and a DVD player 53 are connected through HDMI cable 55. The HDMI cable 55 is a cable using the differential transmission system and is equipped with joining terminal parts 56, 57. The joining terminal part 56 of the HDMI cable 55 is connected to an output part of the DVD player 53. The joining terminal part 57 of the HDMI cable 55 is connected to an input part of the digital television set 51. Digital signals fed out of the DVD player 53 are transmitted at high speed through the HDMI cable 55 to the digital television set 51.

The digital television set 51 is equipped with a signal transmission circuit SC in the input part thereof. The signal transmission circuit SC, as shown in FIG. 7, is provided with a common-mode choke coil CC, and first and second varistors 61, 71. When the joining terminal part 57 of the HDMI cable 55 is connected to the input part of the digital television set 51, the terminal electrodes 1 of the common-mode choke coil CC are connected to corresponding terminals of the joining terminal part 57.

The first varistor 61 has input/output terminals 63, 65. The input terminal 63 of the first varistor 61 is connected to the terminal electrode 1 of the common-mode choke coil CC. The output terminal 65 of the first varistor 61 is connected to the ground potential. This results in locating the first varistor 61 after the common-mode choke coil CC and electrically connecting the first varistor 61 in parallel to the common-mode choke coil CC.

The second varistor 71 has input/output terminals 73, 75. The input terminal 73 of the second varistor 71 is connected to the terminal electrode 1 of the common-mode choke coil CC. The output terminal 75 of the second varistor 71 is connected to the ground potential. This results in locating the second varistor 71 after the common-mode choke coil CC and electrically connecting the second varistor 71 in parallel to the common-mode choke coil CC.

Since the common-mode choke coil CC is inserted before the first and second varistors 61, 71 as described above, it is feasible to suppress the reduction of the characteristic impedance due to the first and second varistors 61, 71. Signals fed out of the DVD player 53 are supplied with little external noise through the HDMI cable 55 and the signal transmission circuit SC to the digital television set 51.

The above described the preferred embodiments of the present invention, but the present invention is not always limited to these embodiments. The common-mode choke coils of the above embodiments are the common-mode choke coils produced by the thin-film forming technology, so called the common-mode choke coils of the thin-film type, but the present invention is not limited to this type. The common-mode choke coils according to embodiments of the present invention may also be common-mode choke coils produced by printing technology, so called common-mode choke coils of the multilayer type.

In the embodiments, the second lead conductor 11, 41 and the third lead conductor 17, 43 are of meander shape or spiral shape, but the invention is not limited to this. For example, the first lead conductor 5 and the fourth lead conductor 21 may be formed in meander shape or in spiral shape. The combination of the second lead conductor 11, 41 and the third lead conductor 17, 43 and the combination of the first lead conductor 5 and the fourth lead conductor 21 both may be formed in meander shape or in spiral shape. Where the first lead conductor 5 and the fourth lead conductor 21 are formed in meander shape or in spiral shape, the first lead conductor 5 and the fourth lead conductor 21 need to be arranged so that they scarcely overlap with the first coil conductor 9 and the second coil conductor 15, when viewed from the stack direction of the layer structure LS.

In the embodiments the first coil conductor 9 and the second coil conductor 15 are magnetically coupled to each other in a state in which they are stacked through the third insulating layer 13. However, the first coil conductor 9 and the second coil conductor 15 may be magnetically coupled to each other in a state in which the first coil conductor 9 and the second coil conductor 15 are arranged along each other with a predetermined space on a common surface.

The present invention can also be applied to a common-mode choke coil array having plural sets of first coil conductor 9 and second coil conductor 15.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A common-mode choke coil comprising:
   first and second coil parts magnetically coupled to each other;
   a first inductance part electrically connected in series to the first coil part; and
   a second inductance part electrically connected in series to the second coil part, wherein
   the first inductance part is not substantially magnetically coupled to the first and second coil parts, and a coupling factor between the first inductance part and the first coil part and a coupling factor between the first inductance part and the second coil part are not more than 0.1;
   the second inductance part is not substantially magnetically coupled to the first and second coil parts, and a coupling factor between the second inductance part and the first coil part and a coupling factor between the second inductance part and the second coil part are not more than 0.1; and
   the first inductance part and the second inductance part are not substantially magnetically coupled to each other, and a coupling factor between the first inductance part and the second inductance part is not more than 0.1.

2. The common-mode choke coil according to claim 1, wherein each of the first and second inductance parts comprises a conductor of meander shape.

3. The common-mode choke coil according to claim 1, wherein each of the first and second inductance parts comprises a conductor of spiral shape.

4. The common-mode choke coil according to claim 1, wherein
   the first coil part includes a first coil conductor disposed between magnetic layers;
   the second coil part includes a second coil conductor disposed between the magnetic layers; and
   each of the first and second inductance parts includes a conductor disposed between the magnetic layers.

5. The common-mode choke coil according to claim 4, wherein the first coil conductor and the second coil conductor are stacked through an insulator.

6. The common-mode choke coil according to claim 4, wherein
the first coil conductor and the conductor included in the first inductance part are located on a common surface; and
the second coil conductor and the conductor included in the second inductance part are located on a common surface.

7. A common-mode choke coil comprising:
magnetic layers;
a first coil part including a first coil conductor disposed between the magnetic layers;
a second coil part including a second coil conductor disposed between the magnetic layers;
a first inductance part electrically connected in series to the first coil part and not substantially magnetically coupled to the first coil part, and including a conductor disposed between the magnetic layers; and
a second inductance part electrically connected in series to the second coil part and not substantially magnetically coupled to the second coil part, and including a conductor disposed between the magnetic layers, wherein
the first and second coil conductors are stacked through an insulator, and the first and second coil parts are magnetically coupled to each other, and
the conductor included in the first inductance part does not overlap with the conductor included in the second inductance part when viewed from a stack direction of the first and second coil conductors.

8. The common-mode choke coil according to claim 7, wherein
the first coil conductor is connected to the conductor included in the first inductance part;
the second coil conductor is connected to the conductor included in the second inductance part; and
a connecting portion of the first coil conductor and the conductor included in the first inductance part and a connecting portion of the second coil conductor and the conductor included in the second inductance part are displaced from each other when viewed from a stack direction of the first and second coil conductors.

9. The common-mode choke coil according to claim 7, wherein
the conductor included in the first inductance part does not overlap with the first and second coil conductors; and
the conductor included in the second inductance part does not overlap with the first and second coil conductors.

10. The common-mode choke coil according to claim 7, wherein a characteristic impedance is defined as $100\Omega \pm 15\%$.

11. The common-mode choke coil according to claim 1, wherein a characteristic impedance is defined as $100\Omega \pm 15\%$.

* * * * *